United States Patent [19]

Mizoue et al.

[11] Patent Number: 4,922,445

[45] Date of Patent: May 1, 1990

[54] LOGIC CIRCUIT SIMULATION METHOD

[75] Inventors: Yoshito Mizoue; Yoshiharu Kazama, both of Hadano, Japan

[73] Assignee: Hitachi, Ltd., Tokyo, Japan

[21] Appl. No.: 128,584

[22] Filed: Dec. 4, 1987

[30] Foreign Application Priority Data

Dec. 9, 1986 [JP] Japan ............................ 61-293058

[51] Int. Cl.[5] ...................... G01R 31/28; G06F 11/00
[52] U.S. Cl. ...................................... 364/578; 371/23
[58] Field of Search .................... 364/578; 371/23, 24, 371/25, 26, 27

[56] References Cited

U.S. PATENT DOCUMENTS

| | | | |
|---|---|---|---|
| 3,715,573 | 2/1973 | Vogelsberg | 371/23 |
| 4,342,093 | 7/1982 | Miyoshi | 364/578 |
| 4,534,028 | 8/1985 | Trischler | 371/25 |
| 4,590,581 | 5/1986 | Widdoes, Jr. | 364/578 |
| 4,644,487 | 2/1987 | Smith | 364/578 |
| 4,696,006 | 9/1987 | Kawai | 371/27 |
| 4,747,102 | 5/1988 | Funatsu | 371/23 |

FOREIGN PATENT DOCUMENTS 59-117660  7/1984  Japan .

Primary Examiner—Felix D. Gruber
Attorney, Agent, or Firm—Antonelli, Terry & Wands

[57] ABSTRACT

A logic circuit simulation method for simulating a logic circuit including a plurality of logic blocks, in which after having simulated the whole simulation object logic circuit, signal variation information of an arbitrary logic block is taken out from the simulation result, the information thus taken out is given to the logic blocks, and a renewed simulation is executed for every logic block.

6 Claims, 3 Drawing Sheets

FIG. 2

| TIME | NAME OF SIGNAL | SIGNAL VALUE | NAME OF SIGNAL | SIGNAL VALUE | | |
|------|----------------|--------------|----------------|--------------|---|---|
| $t_0$ | A | 0 | B | 0 | | |
| ↓ | | | ↓ | | | |
| $t_n$ | A | 1 | B | 0 | | |

8

| TIME | NAME OF SIGNAL | SIGNAL VALUE | NAME OF SIGNAL | SIGNAL VALUE | | |
|------|----------------|--------------|----------------|--------------|---|---|
| $t_0$ | A | 0 | F | 0 | | |
| ↓ | | | ↓ | | | |
| $t_n$ | A | 1 | M | 0 | | |

8'

LOGIC CIRCUIT SIMULATION METHOD

BACKGROUND OF THE INVENTION

The present invention relates to logic circuit simulation method for verifying a logic circuit by use of a computer and in particular to a logic circuit simulation method suitable for verifying a large scale logic circuit.

In general, the logic circuit simulation is used for verifying whether a logic circuit is properly designed. Usually, for this kind of simulation, logic verification is effected by forming an object logic circuit on a computer for general use, giving an input terminal thereof signal information such as 0, 1 etc. storing signal variation information of each gate, element, etc. within the circuit in a file such as a disc, and comparing it with an expected value. However, for the logic simulation of a large scale logic circuit, the amount of file for storing the variation information of the output of all the elements, etc. is enormous and therefore because of physical restriction it is necessary to restrict information outputted to the file. For this reason information necessary for searching the cause of erroneous operations in the simulation object logic circuit is apt to be short and heretofore a plurality of logic simulation processes have been carried out for the same logic circuit in order to search the cause of one erroneous operation.

As a known example, by which a new logic simulation is effected on the basis of results of a logic simulation, e.g. Japanese Patent Unexamined Publication 59-117660 can be cited.

According to the prior art techniques described above, it is necessary to effect a plurality of logic simulation processes for the same object logic circuit in order to search the cause of one erroneous operation. Since, for a large scale logic circuit, operations by means of a computer necessary for every logic simulation take a long time and further the amount of the logic simulation operations in order to search the cause of erroneous operations increases. Also computer operation time increases and the period of time for searching the cause is elongated.

SUMMARY OF THE INVENTION

The object of the present invention is to provide a logic circuit simulation method, which is capable of reducing logic simulation processes for a large scale logic circuit, shortening the computer operation time and at the same time shortening the period of time for searching the cause.

According to the present invention, in a first stage thereof signal variation information is output to an output result file as a result of a simulation of a large scale logic circuit, etc. The logic circuit includes a plurality of logic blocks such as LSI units having circuits equivalent to several hundreds of gates or more. The signal variation information is outputted to an output result file in correspondence to input/output signal lines of each of the logic block. In a second stage the logic circuit is operated in a manner in order to search the cause of erroneous operations. Particularly signal variation information corresponding to the input/output signal lines of a logic block in which an erroneous operation occurred is obtained from the signal variation information stored in the output result file in the first stage. Thereafter, the obtained signal variation information is used as a signal input source in a second logic simulation. The second simulation is effected for each logic block by supplying the input terminal of the erroneously operating logic block the signal input source thereby outputting detailed information of the operation of each logic block relative to the erroneous operating logic block to the output result file.

That is, according to the present invention, when signal variations between different logic blocks in the output result file are variations in the result obtained by simulating the whole logic circuit, even if the logic simulation for each logic block is effected by using the signal variation information as input signal source, the operation content is in accordance with that described previously. It is also possible to reduce remarkably the memory capacity necessary for expressing a logic circuit in the form of a model by effecting a logic simulation for each logic block with respect to the case where a logic simulation is effected for the whole logic circuit. Furthermore, since the number of elements, which are to be simulated, is small, it is possible to shorten the processing time by use of a computer. Consequently, in a time sharing system, etc., by which many processings are effected in a restricted memory area, a simulation of a large scale logic circuit is made possible by effecting a logic simulation according to this invention, which reduces remarkably processing time and the necessary memory capacity. Conventional methods of logic simulation of a large scale logic circuit cause too long a turnaround time of other jobs in the aspect of the processing time and the necessary memory capacity and the conventional methods were impossible to execute in a time sharing system. Furthermore, according to the present invention, dispersion of processing is made possible, by which simulation processing is effected separately for each logic block, using a plurality of processing devices. In this way it can be used to shorten turnaround time to obtain the result of the simulation.

BRIEF DESCRIPTION OF THE DRAWINGS

FIG. 2 is a scheme for explaining an example of the result of a logic simulation output.

DESCRIPTION OF THE PREFERRED EMBODIMENTS

Figure 1:
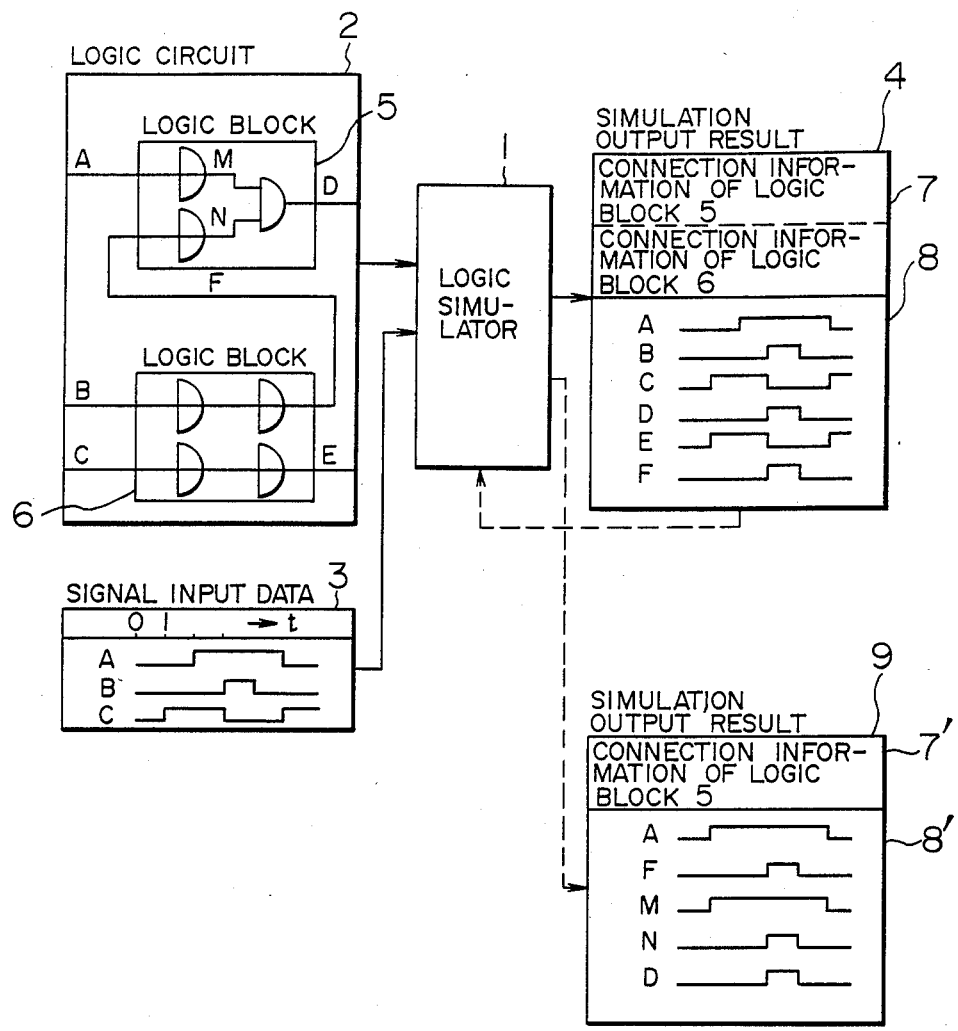
FIG. 1 is a scheme illustrating the construction of an embodiment of the present invention.

Hereinbelow an embodiment of this invention will be explained, referring to the drawings.

FIG. 1 is a scheme illustrating the construction of an embodiment of the present invention. In a first step of the present invention, a logic simulation includes the steps of inputting circuit data of a logic circuit 2, which is the object to be simulated, including a plurality of logic blocks such as LSI, etc., and signal input data 3, providing variations in each of input signals for verifying the logic circuit 2 in a logic simulator 1 which outputs connection information between logic blocks to a simulation output result 4, providing to the inputs of basic elements such as AND gates, OR gates, etc. included within a logic circuit 2 the value of the signals indicated by the signal input data 3, and transmitting signal variations as output value for each of the basic elements in a succeeding time period after a delay time of the basic elements in accordance with a net list of the connection information between the elements. The signal variations being transmitted, after the output value of each of the elements have been generated. By examining the signal variations obtained by the simulation signal changes in signal lines corresponding to those between the logic blocks can be detected. Thus, after establishing correspondence of the signal lines with the input/output lines of each logic block, signal names, changed signal values, and time of changes are outputted as the simulation output result 4. This output result 4 includes connection information 7, outputted at the time of starting the simulation, such as the name of the input/output signals of each of the logic blocks 5, 6 in the logic circuit 2, and signal variation information 8 outputted at each simulation time. The connection information 7' and the signal variation information 8' are results obtained by resimulation of the logic circuit 2 in order to generate detailed information regarding an erroneously operating logic block.

FIG. 2 shows the signal variation information 8 in the output result 4 in detail and includes the time indicated in a time control table, which the logic simulator 1 has in order to control the signal transmission produced by the simulation in the logic circuit, the name of the input/output signals (A, B, ... ) of the elements, which are varied at that time, and the value of the varied signals, e.g. 1 when they vary to the high level and 0 when they vary to the low level.

When it was judged, based on the content of this output result 4, that there were some defects in the operation of the logic block 5, according to the prior art method in the second stage, the simulation of the whole logic circuit was executed by indicating to output the content of the logic block 5 in detail and inputting again the output of the object logic circuit 2 and the signal input data 3 in the logic simulator 1. For this reason a memory capacity and a processing time, whose amounts are equal to those used for a preceding logic simulation, were necessary. However, according to the present invention, for the execution of such a renewed logic simulation which corresponds to the second stage, the circuit data of the logic block 5 for example which may be operating erroneously in the object logic circuit 2 and the results extracted from the output result 4 as signal variation information of the names of signal (e.g. A, F, ... ) connected with the input terminal of the relevant object logic block 5 are inputted in the logic simulator 1; a logic simulation of the logic block 5 is executed by using the extracted signal value as input signal value of the logic block 5; and detailed result (e.g. M, N, ... ) of the logic block 5 is outputted to an output result 9. The signal variation information 8 of the output result 4 is variation information of the result obtained by simulating the whole object logic circuit 2 and there is no contradiction in the content of the operation, when a renewed simulation of each of the logic blocks 5, 6, etc. is executed by using this signal variation information 8 as a signal supplying source.

Figure 3:
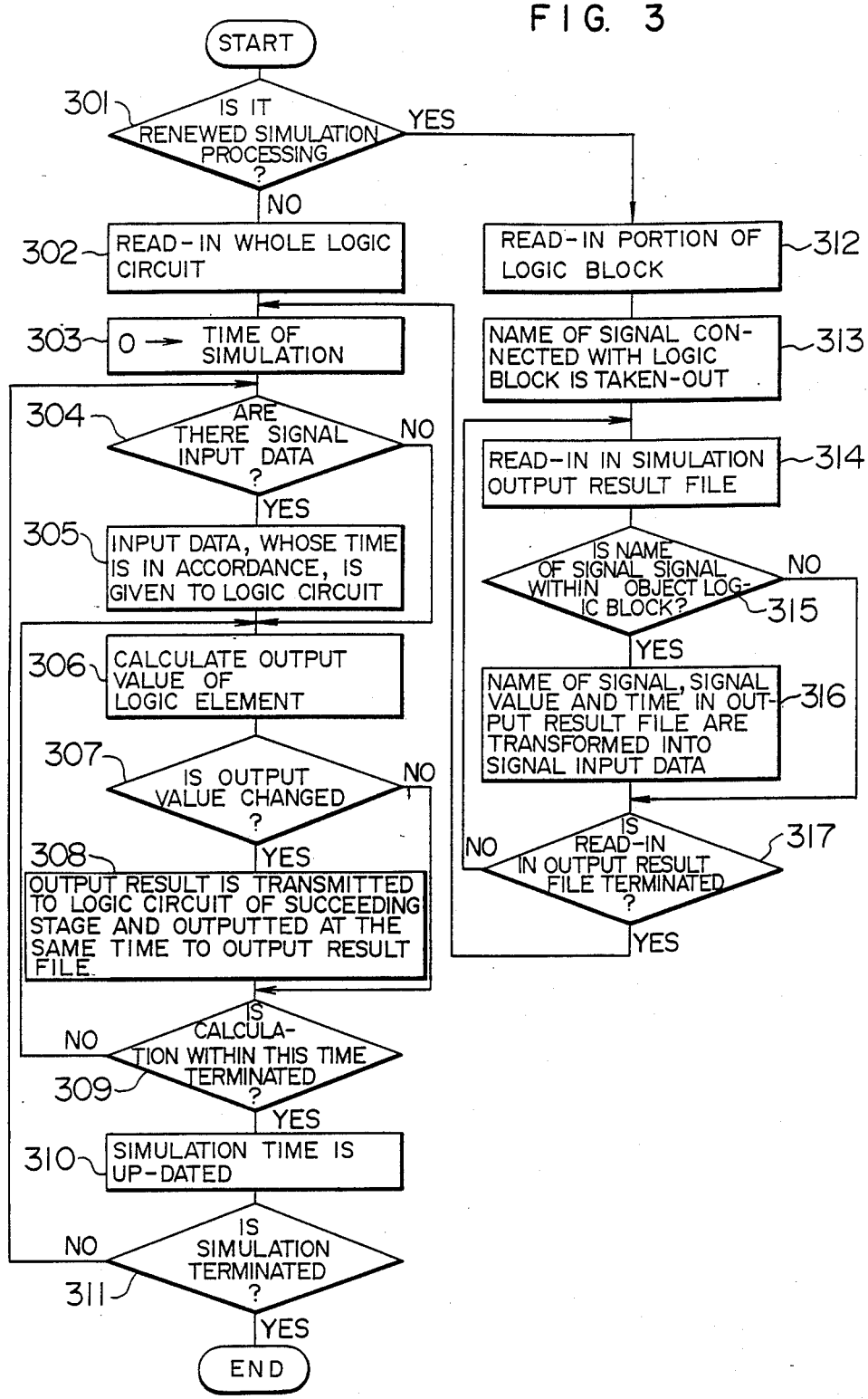
FIG. 3 is a flow chart showing an example of the logic simulator indicated in FIG. 1.

FIG. 3 is a flow chart indicating the processing operation of the logic simulator 1.

The procedure in the first stage for performing the whole logic simulation for the object logic circuit 2 is as follows. After having judged, based on a specification by use of a parameter card, etc., whether it is a renewed simulation processing or not (step 301), if it is not renewed simulation, at first the circuit data of the object logic circuit 2 are read-in and functions of input terminals, gate elements, etc. are transformed into a form, with which signal variations can be generated, such as e.g. Boolean algebra, etc. at this time, the connection information 7 such as the signal names and the terminal names of each logic block is outputted to the output result 4 (step 302). Next the time of the simulation in the time control table included in the logic simulator 1 is initialized (step 303). If there are signal input data 3 (step 304), the signal input data, for which the time of the simulation and the time specified by the signal input data are in accordance with each other, are read in and their signal value is given to the input terminal of the object logic circuit 2 (step 305). When there exist no more signal input data to be given at the same point of time, the output value of each of the logic elements is generated using a predetermined signal value or a signal value transmitted from the preceding logic element (step 306) and it is checked whether the output value is changed or not (step 307). For the signal of the element, whose output value is changed, its signal value is transmitted after the delay time of the element to the succeeding logic element connected therewith. At this time, if the transmitted signal is one which flows through the connecting portion of a logic block on the net list indicating the connection between elements, the name of the signal and the signal value which are in correspondence with the connection information of the logic block are outputted to the output result 4 together with the time of simulation (step 308). In this way, generation of the output value of each of the logic elements is repeated sequentially for each element until there is no element left to generate an output value. When the generation of the output values of all the logic elements within the same simulation time is terminated (step 309), the simulation time is advanced (step 310) and the processing starting from the read-in of the signal input data is repeated till the end time of the simulation in which simulation of a whole test pattern of the signal input data 3 is completed (step 311).

When a specified logic block e.g. 5 is again simulated on the basis of the logic simulation result of the whole object logic circuit, at first the circuit data of the logic circuit 5 are read in and functions of their input terminals, the gates, etc. are transformed into a form, with which signal variations can be generated, such as by the use of Boolean algebra, etc. (step 312) and after the name of the signal connected with the input terminal of the object logic block 5 is taken out at the logic block connection information 7, previously stored in the output result 4 as outputted in the first stage (step 313), the signal variation information 8 is read in (step 314) and the signal variation information corresponding to the name of the connection signal taken out therefrom is taken out and transformed into a signal input data form (steps 315 and 316). When read-in of the signal variation information 8 is totally terminated (step 317), a renewed logic simulation for the logic block 5 is executed by the procedure after step 303. In this case, in the step 308, the signal change information of all the logic elements whose output values have been changed is outputted to the simulation output result 9.

As explained above, according to this invention, since after the logic simulation of a large scale logic circuit has been once executed, for a renewed logic simulation it may be sufficient to execute the logic simulation only at the logic block level, logic simulation processing at the large scale logic circuit level is reduced. Furthermore the memory capacity used at the renewed simulation processing is reduced, multiple processing of a plurality of logic blocks is made possible, and turnaround time of the logic simulation can be improved.

We claim:

1. A logic circuit simulation method for simulating a logic circuit including a plurality of interconnected logic blocks, comprising the steps of:

simulating operation of said logic circuit including said plurality of interconnected logic blocks, outputting connection information of connections between said logic blocks and signal variation information occurring on said connections between said logic blocks at different simulation times and storing said information in an output result file; and extracting only signal variation information, related to a specific erroneously operating logic block to be resimulated, from said signal variation information stored in said output resut file and resimulating said logic circuit by simulating operation of each of said logic blocks relative to said specific erroneously operating logic block to be resimulated using said extracted signal variation information at each simulation time as an input signal source to said specific erroneously operating logic block to be resimulated.

2. A logic circuit simulation method according to claim 1, wherein said signal variation information is outputted to and stored in the output result file in correspondence to input/output signal lines of said connections interconnecting each of the logic blocks.

3. A logic circuit simulation method according to claim 1, wherein said extracted signal variation information corresponds to input terminals of each of the logic blocks and signal values of said signal variation information whose simulation time at the time of the resimulation and whose simulation time at the time of outputting said information for storage in said output result file being coincident with each other is supplied to the input terminals of each of the logic blocks and the input signal source.

4. A logic circuit simulation method according to claim 1, wherein a unit of logic blocks is LSI.

5. A logic circuit simulation method according to claim 2, wherein a unit of logic blocks is LSI.

6. A logic circuit simulation method according to claim 3, wherein a unit of logic blocks is LSI.

* * * * *